United States Patent [19]

Ishikawa et al.

[11] 4,108,715

[45] Aug. 22, 1978

[54] METHOD FOR MACHINING SURFACES OF SEMICONDUCTOR SUBSTRATES

[75] Inventors: Kiyotsugu Ishikawa; Kunio Itoh, both of Takatsuki, Japan

[73] Assignee: Matsushita Electronics Corporation, Japan

[21] Appl. No.: 787,427

[22] Filed: Apr. 14, 1977

[30] Foreign Application Priority Data

Apr. 20, 1976 [JP] Japan .................................. 51-45100

[51] Int. Cl.² .......................................... H01L 21/312
[52] U.S. Cl. .................................... 156/628; 148/187; 156/655; 156/662
[58] Field of Search ................ 156/628, 643, 654–657, 156/662; 148/1.5, 187; 29/580

[56] References Cited

U.S. PATENT DOCUMENTS

| 2,989,385 | 6/1961 | Gianola et al. | 156/643 |
| 3,976,511 | 8/1976 | Johnson | 148/1.5 |
| 4,026,740 | 5/1977 | Owen | 156/657 X |

Primary Examiner—William A. Powell
Attorney, Agent, or Firm—Burgess, Ryan and Wayne

[57] ABSTRACT

A surface of a semiconductor substrate is coated with a mask having a desired doping pattern and the ions of a desired element are accelerated using the mask so that the structure of a predetermined region is changed. Thereafter the doped region or the region not doped is etched and removed.

3 Claims, 12 Drawing Figures

METHOD FOR MACHINING SURFACES OF SEMICONDUCTOR SUBSTRATES

BACKGROUND OF THE INVENTION

The present invention relates to a general method for fabrication of semiconductor devices and more particularly a method for selective etching.

In general, in the process of fabrication of semiconductor devices, a PN junction is formed by diffusion, epitaxial growth, ion injection or the like and thereafter the substrate is machined into a desired shape by scribing, plasma etching, chemical etching, ion etching or the like. In the step of etching, a mask having a desired pattern to be duplicated on the surface of a semiconductor device is coated on the substrate so that the selective etching may be effected.

However, when a semiconductor substrate is etched by the conventional selective etching methods using a mask, the etched patterns are not machined with a satisfactory degree of dimensional accuracy because of the side etching and the dependence of etching rate on the orientation of crystals.

In the field of optical devices handling optical signals, the use of semiconductive optical integrated circuits has recently been increasingly growing. And in semiconductive electric or electronic circuits the circuit element density is increasing particularly in the IC, LSI and microprocessors technologies.

These circuits must be machined with an extremely high degree of dimensional accuracy.

One of the objects of the present invention is therefore to machine or etch a semiconductor substrate to desired configurations with an extremely high degree of dimensional accuracy regardless of the orientations of crystals in the substrate.

DESCRIPTION OF THE PREFERRED EMBODIMENT

First Embodiment, FIGS. 1 and 2

Figure 1A:
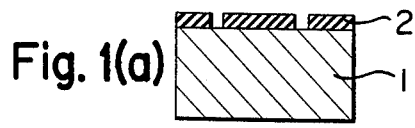
FIGS. 1, 2 and 3 show the steps of a first embodiment, its modification and a second embodiment, respectively, of the present invention.
Figure 1B:
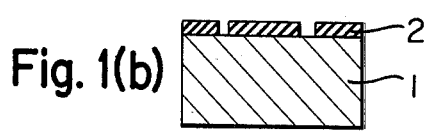
Figure 1C:
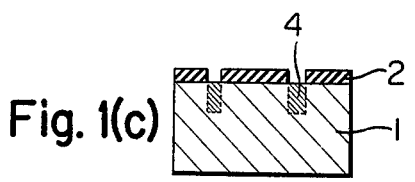
Figure 1D:

Referring to FIG. 1(a), a GaAs semiconductor substrate 1 is coated with a metal mask 2 which is for instance a Ti thin film previously photo-etched to provide a desired pattern. Next as shown in FIG. 1(b) a desired element such as aluminum ions 3 are accelerated to the substrate 1 so that aluminum ions are doped as shown in FIG. 1(c) because the substrate 1 is covered with the Ti mask. Thereafter if required the substrate 1 is subjected to a heat-treatment. A region 4 into which are doped aluminum ions changes its structure to GaAlAs. The next step is to remove the metal mask 2 and the substrate is immersed into a chemical etchant containing phosphorus or hydrofluoric acid so that only the region where the structure changed to GaAlAs is selectively etched as shown in FIG. 1(d).

Modification

Figure 2A:
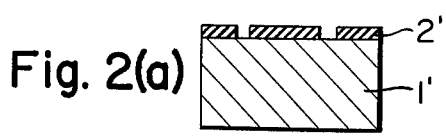
Figure 2B:
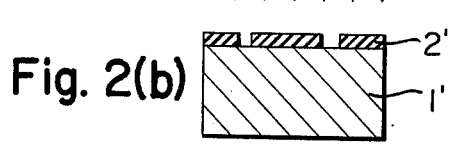
Figure 2C:
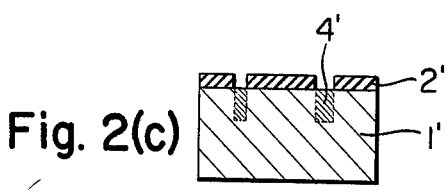
Figure 2D:

The method described above may be also applied to a Si semiconductor substrate. Referring to FIG. 2(a), a Si substrate 1' is masked with a Ti mask 2', and as shown in FIG. 2(b) oxygen ions 3' are accelerated to the substrate 1' so that the structure of a region 4' is selectively changed to $SiO_2$. Thereafter the mask 2' is removed and only the region 4' is etched with hydrofluoric acid as shown in FIG. 2(d).

In the first embodiment and its modification the ions of a desired element are doped and only the doped regions are selectively etched and removed, but it is also possible to etch and remove the regions except the doped regions as will be described below.

Second Embodiment, FIG. 3

Figure 3A:
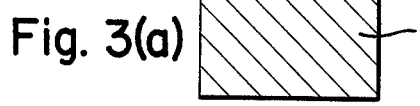
Figure 3B:
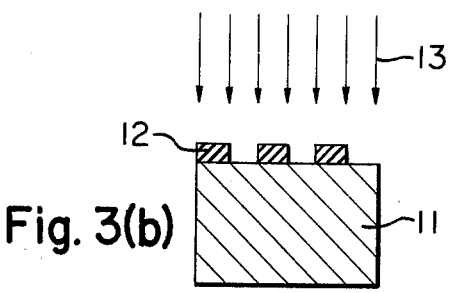
Figure 3C:
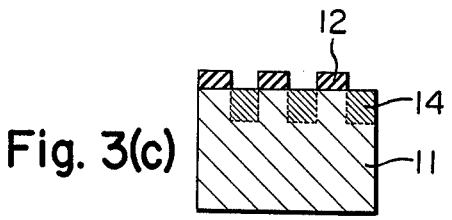
Figure 3D:
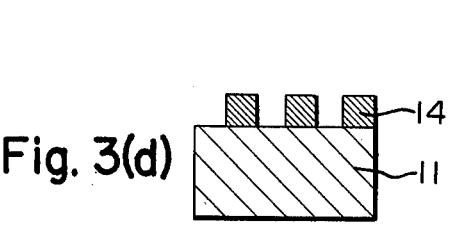

Referring to FIG. 3(a) a Si substrate 11 is covered with a Ti mask (previously photo-etched) to a desired pattern. Next as shown in FIG. 3(b) nitrogen ions 13 are accelerated toward the substrate 11 so that regions 14 are doped and the structure of each region 14 is changed to $Si_3N_4$ as shown in FIG. 3(c). Thereafter the Ti mask 12 is removed and the substrate 11 is immersed into a chemical etchant such as $HF:HNO_3 = 1:10$ so that the Si regions which have not been doped may be etched and removed as shown in FIG. 3(d).

In summary, according to the present invention the ions of a desired element is selectively doped into a semiconductor substrate with an ion injection or doping device to change the structure of the doped regions, and thereafter the doped regions or the regions not doped are selectively etched and removed. The method of the present invention enables to machine a semiconductor substrate with an extremely higher degree of accuracy, and the machining accuracy is substantially dependent upon the accuracy of a mask pattern used when the ions are doped. The penetration of ions is dependent upon the capability of an ion injection or doping device.

The method in accordance with the present invention may completely eliminate the side etching of a substrate which often results when the prior art methods are used. In addition, the use of the method of the present invention will not result in the decrease in machining accuracy due to a orientation dependence of the etching rate due to the structure of crystals of a semiconductor substrate opposed to the prior art chemical etching methods utilizing masks.

In addition to the aluminum, oxygen and nitrogen ions, the ions of Group III or V of the Periodic Table such as In, P. Sb and so on may be doped and the doped regions or the regions not doped may be selectively etched and removed in a manner substantially similar to that described above. Particularly the present invention is very advantageous when the ions of an element of a chemical semiconductor substrate are doped into the substrate and the doped regions are selectively etched and removed.

The method of the present invention may be advantageously used in the fabrication of optical integrated circuits. For instance when a semiconductor laser and a optical waveguide are fabricated on the same substrate, it is preferable to reduce the distance between the end face of the active region of the semiconductor laser and the waveguide as short as possible and it is more preferable to reduce the distance less than one micron milimeter. According to the present invention this distance can be controlled with an extremely high degree of accuracy so that the laser light can be transmitted to the waveguide without loss. The present invention is also very advantageous when it is used to fabricate a directional coupler on a substrate because the spacing between waveguides may be reduced to such an extent as unattainable by the prior art methods so that the coupler without loss may be fabricated.

In the fabrication of distribution feedback type lasers the method of the present invention may be also advantageously used because on the surface of the active region may be formed periodic slits of the order of thousands Å with a high degree of accuracy so that a semiconductor laser capable of emitting light of a desired wavelength may be fabricated in a simpler manner.

As described above, the present invention relates to a method for fabrication of semiconductor devices characterized by selectively doping ions of a desired element into a predetermined region of a semiconductor substrate thereby selectively changing the structure of the semiconductor substrate and thereafter selectivingly etching the semiconductor substrate depending upon the change of the structure. Since the machining accuracy is remarkably improved, the method of the present invention will find a variety of applications especially in the field of fabrication of optical integrated circuits.

What is claimed is:

1. A method for machining the surface of a gallium arsenide crystalline semiconductor substrate, comprising the steps of:
   selectively doping a portion of said substrate surface with aluminum ions to change said surface portion from crystalline gallium arsenide to crystalline gallium aluminum arsenide; and
   selectively etching said substrate surface to remove only the gallium arsenide or the gallium aluminum arsenide portion thereof.

2. The method according to claim 1, wherein an etchant comprising hydrofluoric acid or phosphoric acid is used in said selective etching step.

3. The method according to claim 1, wherein said surface is masked by a titanium mask prior to said selective doping step.

* * * * *

UNITED STATES PATENT OFFICE
CERTIFICATE OF CORRECTION

Patent No. 4,108,715  Dated August 22, 1978

Inventor(s) Kiyotsugu Ishikawa, et al

It is certified that error appears in the above-identified patent and that said Letters Patent are hereby corrected as shown below:

In the Abstract, line 2: "doping" should be cancelled.

In the Abstract, line 3: After "desired" insert --doping--.

Column 2, lines 59-60: "milimeter" should be --millimeter--.

Signed and Sealed this

Seventeenth Day of July 1979

[SEAL]

Attest:

LUTRELLE F. PARKER
Attesting Officer    Acting Commissioner of Patents and Trademarks